United States Patent [19]

Chamberlayne

[11] 4,012,703

[45] Mar. 15, 1977

[54] TRANSMISSION LINE PULSE TRANSFORMERS

[75] Inventor: John Walter Chamberlayne, Crawley, England

[73] Assignee: U.S. Philips Corporation, New York, N.Y.

[22] Filed: Nov. 12, 1975

[21] Appl. No.: 631,059

[30] Foreign Application Priority Data

Nov. 29, 1974 United Kingdom .................. 51763

[52] U.S. Cl. ........................ 333/24 R; 333/29.31 C; 333/84 R; 336/83; 336/200

[51] Int. Cl.² .......................................... H03H 7/00

[58] Field of Search ............. 328/65; 333/24 R, 29, 333/31 R, 31 C, 84 R; 336/83, 200

[56] References Cited

UNITED STATES PATENTS

| | | | |
|---|---|---|---|
| 3,226,665 | 12/1965 | Luna | 333/24 R X |
| 3,263,191 | 7/1966 | Arvonio | 333/24 R |
| 3,413,716 | 12/1968 | Schwertz et al. | 336/200 X |
| 3,609,613 | 9/1971 | Horn et al. | 336/83 |

*Primary Examiner*—Paul L. Gensler

*Attorney, Agent, or Firm*—Frank R. Trifari; George B. Berka

[57] ABSTRACT

A transmission line pulse transformer in which the characteristic impedance of a coiled transmission line is changed from a first value to a second (smaller) value at a first point intermediate its ends and back to the first value at a second point. The location of the points and the relationship between the two impedance values are so chosen that, to a first order approximation, reflected waves from the points cancel coupled waves between adjacent turns, thereby reducing distortion caused by the coupled waves.

7 Claims, 10 Drawing Figures

Fig. 6.
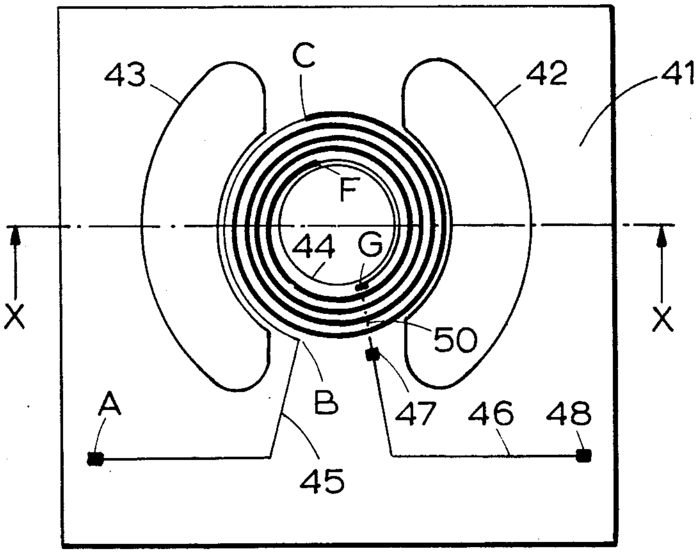
Fig. 7.
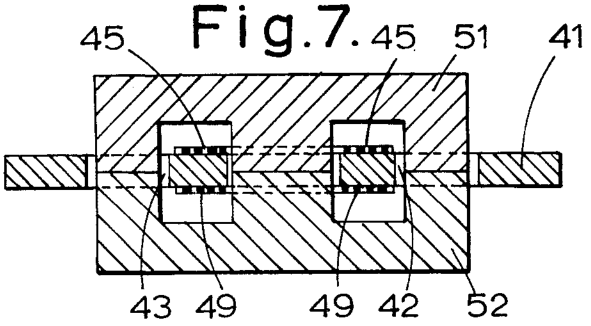
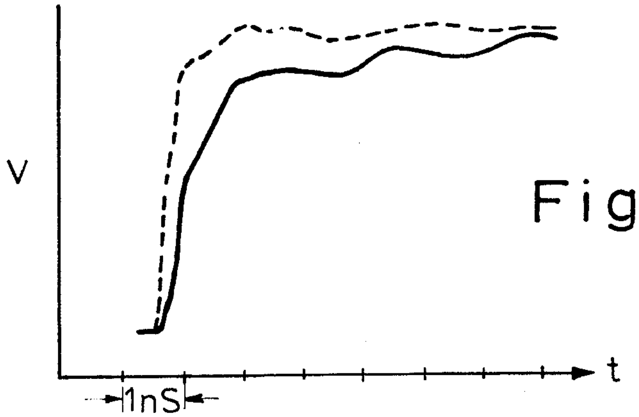
Fig. 10.

TRANSMISSION LINE PULSE TRANSFORMERS

This invention relates to transmission line pulse transformers.

A brief description of such transformers will first be given with reference to FIGS. 1 to 3 of the accompanying drawings.

Figure 1:
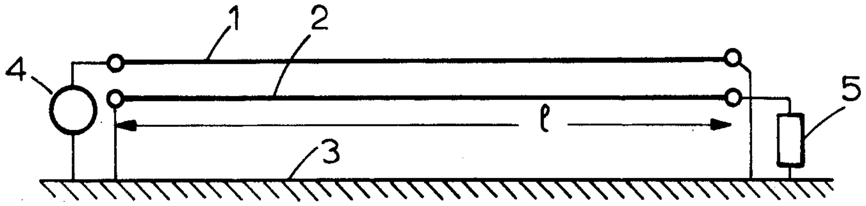
PRIOR ART Fig.1.

FIG. 1 shows a transmission line of length 1 comprising two parallel conductors 1 and 2 arranged above a ground plane 3. Due to the capacitive and inductive coupling between the two conductors 1 and 2, a wave travelling in one direction along one conductor generates a wave travelling in the opposite direction in the other conductor. Thus the transmission line can be used as an inverting transformer; the circuit of FIG. 1 showing such a use. At one end of the transmission line, conductor 1 is connected to a step voltage generator 4 and conductor 2 is connected to the ground plane. At the other end of the line, conductor 1 is connected to the ground plane and conductor 2 is connected to the ground plane via a load 5 having an impedance equal to the characteristic impedance Zo of the transmission line. Step voltage generator 4 generates a step voltage which rises from zero to a voltage E. If Vdf is the difference voltage and Vav is the average voltage (so-called common-mode signal) between conductors 1 and 2, then $Vdf = V1 - V2$ and $Vav = \frac{1}{2}(V1 + V2)$, where V1 ad V2 are the voltages (with respect to ground) on conductors 1 and 2 respectively.

A step voltage E propagated along the line from generator 4 reaches load 5 after a transit time $1/c$ where $c$ is the signal velocity along the line. If Zo is the characteristic impedance of the line and Zg is the impedance of each conductor to ground then, at the end of the transit time, $Vdf = E/(1 - Zo/Zg)$ and $Vav = -\frac{1}{2}E/1(1 - Zo/Zg)$.

Figure 2:
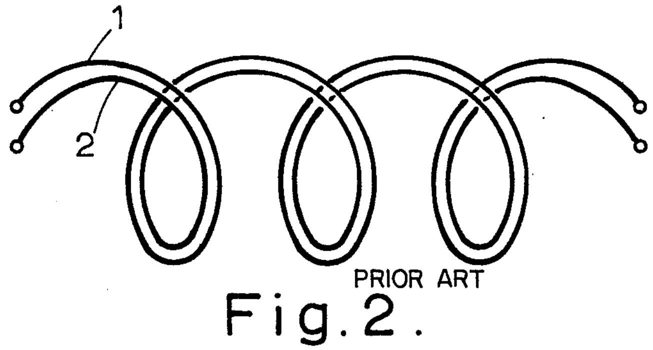
PRIOR ART Fig.2.

As is known, the factor Zo/Zg can be decreased by winding the transmission line into a coil, as depicted in FIG. 2. By arranging a suitable number of turns of the transmission line around a magnetic (e.g. ferrite) core, the inductance can be made sufficiently large that Zg>>Zo and, hence, *Vdf* becomes substantially equal to E and *Vav* becomes substantially equal to $-\frac{1}{2}E$. Thus the addition of inductance reduces signal losses.

Figure 3:
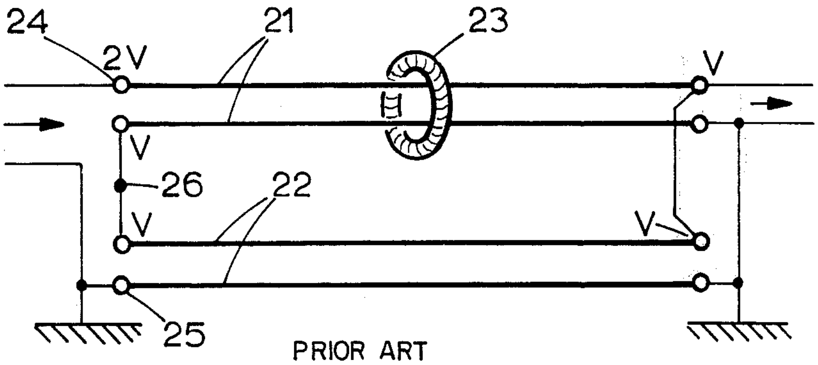
PRIOR ART Fig.3.

A 2:1 double-unbalanced transmission line pulse transformer can be constructed as shown in FIG. 3 by connecting two transmission lines 21 and 22 in series at one end and in parallel at the other. If a step voltage $E = 2V$ (with respect to ground) is applied at input 24, then voltages V occur at the points shown and it can be seen that different voltages occur at the ends of line 21 whereas the voltages at the ends of line 22 are the same. Line 21 is provided with an increased inductance, as represented by a toroid 23 surrounding the line. Since there is no voltage change in line 22, added inductance would not have the effect described above. If the transformer is to be used for very high frequencies, however, it is useful to provide a corresponding inductance in line 22 in order to equalize the high frequency properties (characteristic impedance, transit time, etc.) of the two lines. A separate core must be used for line 22, of course, since line 22 is in effect short-circuited. Thus the transformer of FIG. 3 can be regarded as comprising two identical transformers of the type depicted in FIG. 2.

The double-unbalanced transformer shown in FIG. 3 can be modified to provide a balanced-unbalanced transformer by removing the ground connection from input 25 and connecting it to point 26. If balanced step voltages +V and −V are applied to terminals 24 and 25 respectively, the ouput voltage level is substantially +V; i.e. an inductance is now required in line 22 to increase Zg and not in line 21.

3:1, 4:1, and more complex transformers can, of course, be constructed in similar fashion; several such transformers being described, for example, in "Some Broad Band Transformer", C. L. Ruthroff, Proc. IEEE, Vol. 47 No. 8 p. 1337, 1959.

If d.c. isolation between input and output is required in transmission line transformers, isolating capacitors can be inserted in series with the appropriate conductors.

In an article "Directional electromagnetic couplers" by B. M. Oliver (Proc. IRE, Vol. 42, No. 11, p. 1686, 1954), the author gives formulae for the contradirectional coupling between two identical transmission lines running parallel with each other over a distance $l$ in terms of a coupling constant $k$:

$$k = Cm/Ci$$

where $Cm$ is the mutual capacitance between adjacent transmission lines, and $Ci$ is the self capacitance of each transmission line.

If an incident step wave of unit magnitude is propagated along one transmission line, a contradirectional coupled wave is propagated along the other line. If the incident wave is initiated at one end of one line at time $t = 0$, Oliver's formulae, when substituted, to a third order approximation in coupling constant $k$ for $k < 1$, give at time $t = 0$ a coupled wave in the other line of magnitude $\frac{1}{2}k(1 + \frac{1}{4}k^2)$ and, at time $t = 2\ 1/c$ (where $c$ is the propagation velocity) a coupled wave of magnitude $-\frac{1}{2}k$. The magnitude of the transmitted wave at $t = 1/c$) is $1 - \frac{1}{4}k^2$. When a transmission line has coupled lines on either side of it, to a first order approximation the signals on one outer line are not affected by the presence of the other outer line.

In the case of a transmission line coiled up to form an inductive winding, adjacent coil turns form coupled transmission lines to which the Oliver formulae may be applied. Thus an incident wave in one turn will create a contradirectional coupled wave in the adjacent turn. The effect of the coupling will now be explained with reference to FIG. 4 which shows a transmission line pair B-G (represented by a single line in the Figure) coiled into a spirial winding. The characteristic impedance of the line is assumed to be Zo and the line is terminated at G in its characteristic impedance. Line A-B represents a signal input line, impedance also Zo, connected to a signal source (not shown) having an output impedance Zs. Thus an incident wave arriving at G will not be reflected and a coupled wave arriving at A in the direction B-A will have a portion $r$ reflected where $r = (Zs - Zo) / (Zs + Zo)$.

Figure 4:
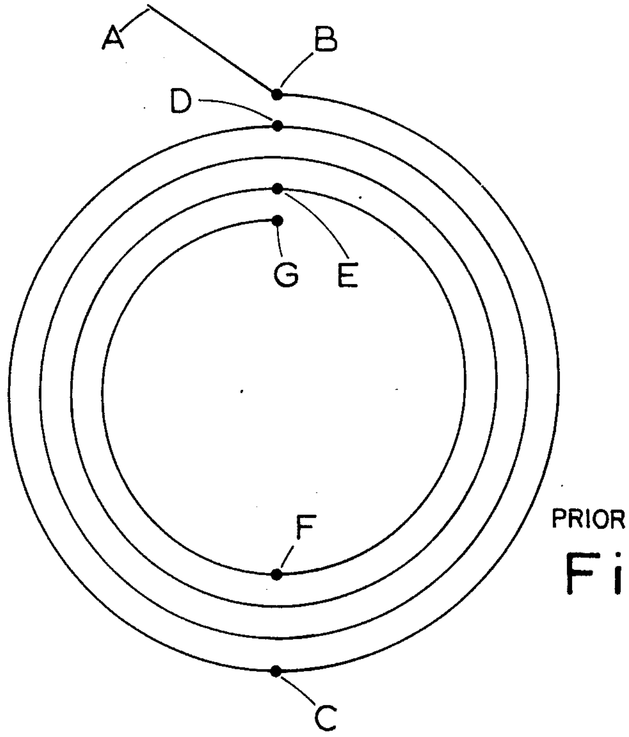
PRIOR ART Fig.4.

In FIG. 4, the time taken for a wave to travel the distance A–B is assumed to be T1, from B–D is T2, from D–E is T3, and from E–G is T4. Points C and F are not relevant to the present discussion and will be referred to hereinafter.

Referring now to FIG. 4, in which incident waves travel clockwise (direction B–G) around the winding and coupled waves travel anti-clockwise (direction G–B), and assuming that an incident wave of unit magnitude is generated at A to arrive at B at time $t = 0$, we have, to a first order approximation in $k$: At $t = 0$ The incident wave passes B, magnitude 1.

A first coupled wave is launched at D, magnitude ½$k$. At $t = T2$.

The incident wave passes D, magnitude 1.

A second coupled wave is launched at B, magnitude ½$k$.

The first coupled wave reaches B where it combines with the second coupled wave to form a first combined wave magnitude $k$. At $t = T1 + T2$.

The first combined wave is reflected at A, value $rk$. At $t = 2T1 + T2$.

The first combined wave again reaches B, now travelling towards G, value $rk$ At $t = T2 + T3$.

The incident wave passes E and a third coupled wave is launched at G, value $-$½$k$. At $t = T2 + T3 + T4$.

The incident wave reaches G

A fourth coupled wave is launched at E, value $-$½$k$.

The third coupled wave reaches E and combines with the fourth coupled wave to produce a second combined wave, value $-k$. At $t = 2T1 + 2T2 + T3 + T4$.

The first combines wave reaches G, magnitude $rk$. At $t = T1 + 2T2 + 2T3 + T4$.

The second combined wave is reflected at A, magnitude $- rk$. At $t = 2T1 + 3T2 + 3T3 + 2T4$.

The second combined wave reaches G, magnitude $- rk$.

Thus the wanted incident output wave at G isfollowed by two unwanted coupled waves, of respective magnitudes $rk$ and $-rk$, which cause signal distortion and limit the bandwidth of the transfer at the higher frequencies, where the coupled waves interfere with subsequent incident waves.

The object of the invention is to mitigate the effects of such coupling and, hence, to increase the bandwidth of such a transformer.

According to the present invention there is provided a transmission line pulse transformer comprising a bifilar winding formed by at least two turns of each of a pair of conductors, which conductors are maintained at a fixed distance from each other throughout their length, wherein the cross-sectional area of each conductor is increased from a first value to a second value at a first point between one third and two thirds the distance around the first turn of the winding and is decreased from the second value to the first value at a second point between one third and two thirds of the distance around the last turn of the winding; said values being so chosen that the relationship between the characteristic impedance Zo of each of the pair portions having the said first value and the characteristic impedance Z1 of the intervening pair portion having said second value is given by:

$$Z1 \triangleq Zo\ [(1-k)/(1+k)\ ]$$

where $k = Cm/Ci$ $Cm$ = the mutual capacitance between pair turns, and $Ci$ = the self-capacitance of the pair.

The effect of changing the characteristic impedance at predetermined points is to cause reflected waves to be generated at these points, the points being so located that, to a first order approximation, these reflected waves cancel the coupled wave referred to above.

The various features and advantages of the invention will be apparent from the following discussion thereon and embodiments thereof, taken by way of example, with reference to FIGS. 1 to 9 of the accompanying drawings, of which: FIGS. 1 to 4 show, respectively, prior art arrangements of transmission lines used as pulse transformers.

Figure 5:
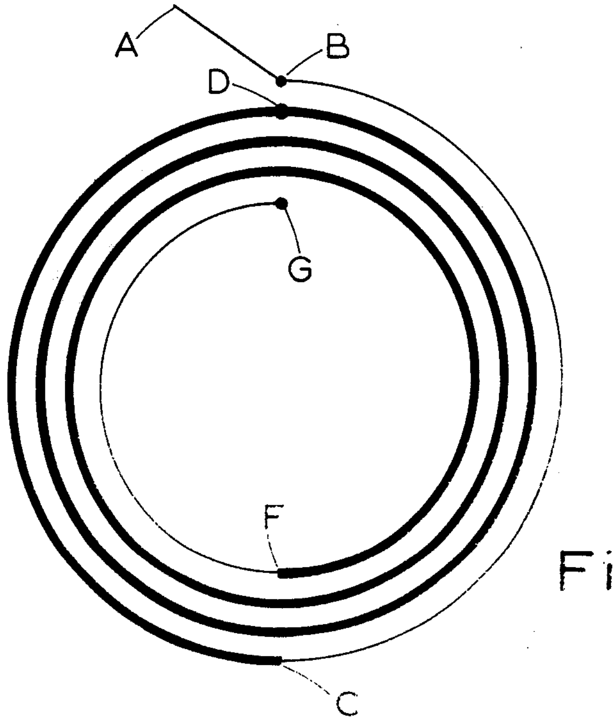
Figure 8:
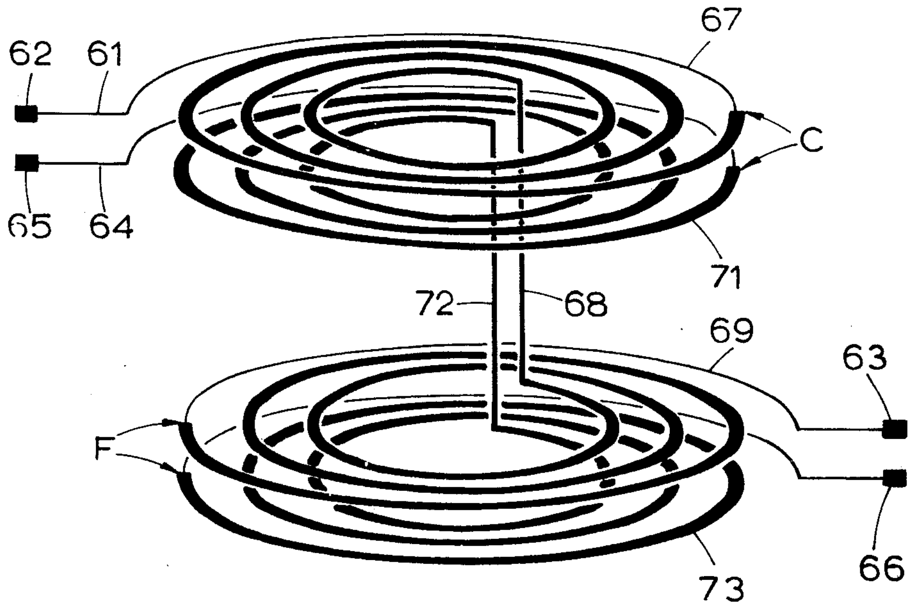
Figure 9:
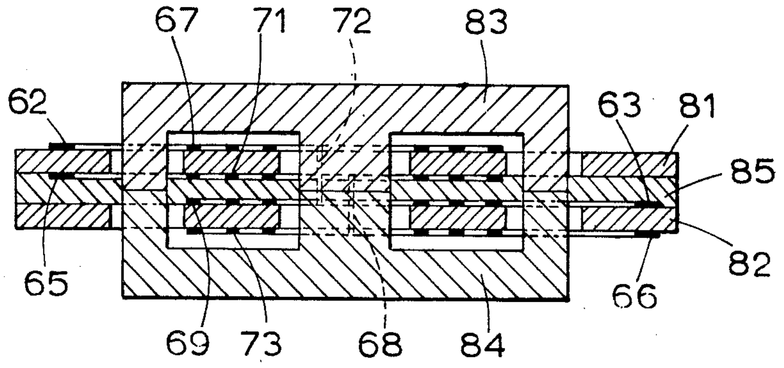

FIG. 5 shows the coiled transmission line of FIG. 4 modified according to the invention, FIG. 6 shows a plan view of a printed circuit board provided with a spiral-wound conductor, FIG. 7 is a cross-section of the circuit board of FIG. 6 together with a ferrite core, FIGS. 8 and 9 shows a transformer arrangement formed by printed conductors on two printed circuit boards, and FIG. 10 shows response curves for the transformers of FIGS. 6 and 7 and FIGS. 8 and 9. Referring now to the drawings, FIGS. 1 to 4 have been discussed in the preceding descriptionof prior art.

FIG. 5 corresponds in all respects to FIG. 4 except that the characteristic impedance of the transmission line is changed at points C and F by increasing the cross-sectional area of each line conductor between these points. The assumption and conditions referred to in relation to FIG. 4 also apply to FIG. 5.

An incident wave of unit height passing C will cause a reflected wave at the point of value $(Z1 - Zo)/(Zl = Zo)$ and will continue with a value of $2Zl/(Zl + Zo)$, where Zo is the characteristic impedance of transmission line portions A to C and F to G, and where $Zl$ is the characteristic impedance of portion C to F.

Thus by making $Z1 = Zo\ [\ (1-k)/1+k)\ ]$, a reflected wave is launched at C, resulting from an incident wave arriving at C in the direction B-C, and will have a value of $-k$ and the incident wave will continue with a value $l$-$k$, again assuming that the arriving incident wave has unit magnitude. The coupled waves referred to in relation to FIG. 4 will still occur, of course, but reflected waves will now additionally be generated as follows: At $t =$ ½$T2$.

The incident wave passes C.

A first reflected wave returns toward B, value $-k$

The incident wave continues, value $l$-$k$. At $t = T2$.

The first reflected wave reaches B, value $-k$.

The first combined coupled wave, referred to in the description of FIG. 4, also reaches B, value $k$.

These two waves cancel each other. At $t = T2 + T3 +$ ½$T4$.

The incident wave reaches F, value $l$-$k$, and continues at value 1 to reach G at $t = T2 + T3 + T4$ as for FIG. 4.

A reflected wave is launched at F, value $k$. At $t = T2 + T3 + T4$.

The reflected wave from F reaches E, value $k$.

The second combined wave, referred to in the description of FIG. 4, appears at E, value $-k$.

These two waves cancel each other.

Thus by introducing the stated impedance changes, the first order coupling effects are offset. A more detailed analysis shows that second order terms (i.e. $k^2$) are not cancelled. In typical applications of such transformers, however, $k$ is fairly small — for example 1/20. Thus a signal voltage level of $k^2$ is about 50 dB down compared with the voltage level of the incident signal wave and, hence, can be ignored for practical purposes.

In order to fulfil the requirement of the relationship $$Z1 = Zo\ [(1-k)/(1+k)\ ] \qquad (1)$$

it is necessary to be able to determine $Zo$ and $k$ for any particular coiled transmission line. The aforementioned article by Oliver shows that, for transmission lines having two parallel circular cross-section conductors each of diameter $a$ and spacing $d$ between centres if two such transmission lines are spaced a distance $s$ apart in a uniform dielectric, then the coupling factor is $$k = \log \sqrt{1+(d/s)^2} / \log(d/a) \quad (2)$$

The characteristic impedance Zo of a transmisison line comprising two parallel circular wire conductors, of diameters $a1$ and $a2$, spaced a distance $d$ apart between centres, in a medium having a relative permittivity Er, is given by:

$$Zo = [120/\sqrt{Er}] \log_e [2d/\sqrt{a1.a2}] \quad (3)$$

(see, for example, Reference Data for Radio Engineers, I.T.T. Corp. 4th Edition, page 592). If the two wires have the same cross-section ($a1 = a2$) equation 3 simplifies to:

$$Zo = [120/\sqrt{Er}] \log_e [2d/a] \quad (4)$$

Thus equations (1), (2) and (3) enable a pulse transformer according to the invention to be designed using a transmission line having two circular conductors.

In a practical embodiment of the invention, described hereinafter, a pulse transformer is provided which covers a bandwidth of 100kHz to 1GHz and in which the transmission lines are microstrip lines on a printed circuit board. Expressions for various characteristics of a microstrip line above a ground plane are derived in an article by H. R. Kaupp entitled "Characteristics of Microstrip Transmission Lines" (IEEE Trans. Electr. Compts., Vol. EC-16, No. 2 page 185, 1967). In the practical embodiment described hereinafter, the two conductors of the transmission line are each formed as a spiral track on a respective major surface of a fibreglass printed circuit board. The characteristic impedance of this arrangement is twice that for a microstrip line over a ground plane with half the thickness of the board. This is because, from symmetry, a ground plane could be interposed between the two conductors on opposing surfaces of the board without affecting the currents or voltages in the conductors. Thus the various equations given by Kaupp can be applied to the abovementioned practical embodiment provided that appropriate adjustment is made for changing from the Kaupp example of a microstrip over a ground plane to a pair of symmetrical conductors. We then have, for the characteristic impedance:

$$Zo = 120/\sqrt{0.475\,Er + 0.67}\ \log_e[2.99d/(0.8w+t)] \quad (5)$$

where:

- $Er$ is the relative permittivity of the fiberglass board,
- $d$ is the thickness of the fiberglass board (i.e. the distance between the conductors),
- $w$ is the width of the conductor track, and
- $t$ is the thickness of the conductor track. Equation (3) can be rearranged in terms of the width $w$:

$$w = 3.75d.\ e^{[-Zo\sqrt{0.475\,Er+0.67/120}\,]} - 1.25t.$$

Equation (2) above applies to the case where the conductors are in a homogeneous dielectric medium. This is not true for the practical embodiment, where the dielectric is partly air and partly fiberglass. Practical experiments have shown that, for printed conductors on a fiberglass board, $$k = 0.8 \log \sqrt{1+(d/s)^2} / \log(d/a). \quad (7)$$

Referring now to FIG. 6, a printed circuit board 41, made of fiberglass, is provided with three cut-outs 42, 43, 44. A conductor 45 (A-G corresponding with that shown in FIG. 5) is printed on one major face of the board together with a lead-out conductor 46 provided at its respective ends with bonding pads 47 and 48. The width of conductor 45 is increased between points C and F in the same manner as shown in FIG. 5. On the underside of board 41, a further printed conductor 49 (shown in FIG. 7) is provided having an identical configuration with conductor 45 such that the two conductors from a coiled transmission line. For each conductor 45 and 49, a respective piece of wire 50 (shown in broken line), connects a bonding pad at point G to bonding pads 47 in such a manner as to avoid contact with the intervening turns of conductors 45 and 49.

FIG. 7 shows a cross-section of board 41 along line X—X of FIG. 6 together with a ferrite pot core comprising two identical cores 51 and 52. The thickness of board 41 and of conductors 45 and 49 has been exaggerated for the purposes of clarity. Each of cores 51 and 52 may, for example, be Type RM6 and RM7 available from Mullard Limited; cut-outs 42, 43 and 44 being suitably shaped in FIG. 6 for accommodating such cores. All conductors are typically of copper; the embodiment shown in FIGS. 6 and 7 being constructed of a standard fiberglass/copper printed circuit board having a board thickness (d) of 400$\mu$M and a copper thickness ($t$) of 35$\mu$M. The permittivity (Er) of fiberglass is 5. References $d$, $t$, and $Er$ relate to equations (5), (6), and (7).

In the practical embodiment shown in FIGS. 6 and 7, the width of conductor sections A to C, F to G, and of conductor 46 was 125$\mu$M. The width of conductor section C to F was 200 $\mu$M. The same applies, of course, to conductor 49. The characteristic impedance of the transmission line sections A to C is thus 150 ohms and that of section C to F is 130 ohms. Coupling factor $k$ is 0.075.

In practical tests of transformers described with reference to FIGS. 6 and 7, it was found that points C and F, at which the cross-sectional area changes, can be located anywhere between one third and two thirds around their respective turns with very little effect on the performance of the transformer. Tests on various other transformer according to the invention, including that described hereinafter with reference to FIG. 8, showed this to be the general rule in all cases; the halfway point being the optimum position.

As can be seen from FIG. 6, wire 50 crosses the turns transversely and, hence, increases the coupling capacitance between the turns. This can be avoided by a construction as shown in FIGS. 8 and 9 in which two parallel printed circuit boards (82, 82, FIG. 9) having copper on both faces are used. The coiled transmission line (FIG. 8) now cmprises a first conductor 61 extending between an input bonding pad 62 and an output bonding pad 63, and a second conductor 64 running parallel with the first and extending between a second input bonding pad 65 and a second output bonding pad 66. Conductor 61 comprises a first spiral winding 67 on one face of board 81, an interconnecting lead 68, and a second spiral winding 69 on one face of board 82. Conductor 64 comprises a first spiral winding 71 on the other face of board 81, an interconnecting lead 72 and a second spiral winding 73 on the other face of board 82. Thus windings 67 and 71 are formed on respective opposing major faces of a printed circuit board 81 and windings 69 and 73 are formed on respective opposing major surfaces of a printed circuit board 82 arranged parallel with the first board. Each board is provided with cut-outs as shown in FIGS. 6 and 7 to accommodate ferrite cores 83, 84. Interconnecting leads 68 and 72 are soldered to the respective conductors and extend through respective holes in each board. As can be seen from FIG. 8, the impedance of the transmission line is changed at point C approximately half-way round the first turn and again at point F approximately half-way round the last turn.

In a practical transformer of this type, each board was of fiberglass having a thickness ($d$) 400 $\mu$M and a relative permittivity ($Er$) of 5, and the boards were spaced apart by a 2mm layer of expanded polystyrene 85. The spiral pitch(s) of the conductor tracks (of copper) was 800 $\mu$M. The width $w$ of the tracks between pad 62 (65) and point C, and also between point F and pad 63, was 124 $\mu$M. The width $w$ of the tracks between points C and F was 160 $\mu$M and the thickness of all tracks was 35 $\mu$M. The characteristic impedance of the transmission line between points C and F was 137 ohms and the characteristic impedance of the remaining portions was 150 ohms. The coupling factor $k$ was 0.044. The two ferrite cores were Type RM (Mullard Limited).

FIG. 10 shows the output voltage waveforms with respect to time $t$ of a transformer as shown in FIGS. 6 and 7 (solid line curve) and a transformer as shown in FIGS. 8 and 9 (broken line curve) in response to a step input waveform. From the Figure, it can be seen that the broken line curve more closely approaches the step input waveform than the solid line curve; showing that the double layer transformer has a higher frequency response.

Measurement of the transfer characteristic of the transformer described above with reference to FIGS. 8 and 9 as a function of frequency showed a response curve within OdB to $-3dB$ over a frequency band of 100 kHz to 1GHz.

In another embodiment, the transmission line comprised twisted wire wound round a toroid of high permeability ferrite made from Type A15 material (Mullard Limited); the wire diameter being changed at the appropriate points to provide the appropriate characteristic impedance relationship described above. Although not as cheap to manufacture as the printed circuit type transformer described above, the choice of a small toroid (and hence a short length of transmission line) enables a transformer to be designed having a considerably shorter transit time than is possible with the printed circuit technique.

Two transformer as described in the above embodiments can, for example, be used to form the transformer shown in FIG. 3 and, of course, is applicable for use in other more complex forms of pulse transformer. FIG. 3 may be implemented, for example, by using the same printed circuit board(s) for both constituent transformers and providing the appropriate interconnections by printed wiring on the board.

What is claimed is:

1. A transmission line pulse transformer comprising a bifilar winding formed by at least two turns of each of a pair of conductors, which conductors are maintained at a fixed distance from each other throughout their length, wherein the cross-sectional area of each conductor is increased from a first value to a second value at a first point between one third and two thirds the distance around the first turn of the winding and is decreased from the second value to the first value at a second point between one third and two thirds of the distance around the last turn of the winding; said values being so chosen that the relationship between the characteristic impedance Zo of each of the pair portions having the said first value and the characteristic impedance Zl of the intervening pair portion having said second value is given by:

$$Zl \triangleq Zo[(1-k)/(1+k)]$$

where $k = Cm/Ci$ $Cm =$ the mutual capacitance between pair turns, and $Ci =$ the self-capacitance of the pair.

2. A transformer according to claim 1 wherein said first and second points are each located substantially half-way round the said first and last turns respectively.

3. A transformer according to claim 1 wherein the turns surround a core of magnetic material.

4. A transformer according to claim 3 wherein the said core is a ferrite core.

5. A transformer according to claim 1, wherein each conductor is formed by printed wiring tracks on a respective face of a printed circuit board, said turns constituting a spiral winding.

6. A transformer according to claim 5 wherein said board is of fiberglass.

7. A transformer according to claim 1, wherein each conductor is formed as first and second spiral windings in series, the two first windings being formed by printed wiring tracks on respective faces of a first printed circuit board and the two second windings being formed by printed wiring tracks on respective faces of a second printed circuit board, and wherein the two boards are in parallel spaced relationship with each other.

* * * * *